United States Patent [19]

Chuang et al.

[11] Patent Number: 6,031,757

[45] Date of Patent: Feb. 29, 2000

[54] WRITE PROTECTED, NON-VOLATILE MEMORY DEVICE WITH USER PROGRAMMABLE SECTOR LOCK CAPABILITY

[75] Inventors: Weitong Chuang, Taichung; Chun-Hsiung Hung, Hsinchu; Kuen-Long Chang, Mucha Taipei; Yin-Shang Liu, Tsao-Twen; Yao-Wu Cheng, Taipei, all of Taiwan

[73] Assignee: Macronix International Co., Ltd., Hsinchu, Taiwan

[21] Appl. No.: 08/825,879

[22] PCT Filed: Nov. 22, 1996

[86] PCT No.: PCT/US96/18674

§ 371 Date: Apr. 2, 1997

§ 102(e) Date: Apr. 2, 1997

[87] PCT Pub. No.: WO98/22950

PCT Pub. Date: May 28, 1998

[51] Int. Cl.[7] ................................................ G11C 16/04
[52] U.S. Cl. .............................. 365/185.04; 365/185.11; 365/185.33
[58] Field of Search ..................... 365/185.04, 185.11, 365/185.12, 185.29, 185.33, 218

[56] References Cited

U.S. PATENT DOCUMENTS

| 5,097,445 | 3/1992 | Yamauchi | 365/185.04 |
|---|---|---|---|
| 5,197,034 | 3/1993 | Fandrich et al. | 365/185.33 |
| 5,349,558 | 9/1994 | Cleveland et al. | 365/200 |
| 5,414,664 | 5/1995 | Lin et al. | 365/218 |
| 5,526,307 | 6/1996 | Yiu et al. | 365/185.01 |
| 5,530,673 | 6/1996 | Tobita et al. | 365/201 |
| 5,619,451 | 4/1997 | Costabell et al. | 365/185.33 |

OTHER PUBLICATIONS

"Smart Voltage Boot Block Flash Memory Family", Intel Flash Memory Data Book, vol. 1, 1996, pp. 5–1 to 5–56.
"Advanced Micro Devices product Am29F080", AMD Flash Memory Book, 1996, pp. 1–163 to 1–196.

*Primary Examiner*—Trong Phan
*Attorney, Agent, or Firm*—Haynes & Beffel LLP

[57] ABSTRACT

A user-programmable write protection scheme provides flexibility and superior write protect features for an integrated circuit memory which comprises an array of non-volatile erasable and programmable memory cells, including a plurality of sectors. Command logic detects command sequences indicating operations for the array, including a program operation, a sector erase operation, a read operation, a sector lock operation, and a sector unlock operation. The sector protect logic includes sector lock memory, including non-volatile memory cells that store sector lock signals for at least one sector in the array. Among other functions, the sector protect logic: 1) inhibits sector erase and program operations to a particular sector in response to a set sector lock signal corresponding to the particular sector, and to a first state of control signals in the set of control signals; 2) enables sector erase and program operations in response to a reset sector lock signal corresponding to the particular sector, and to the first state of control signals in the set of control signals; 3) inhibits sector erase and program operations to the particular sector independent of the sector lock signal in response to a second state of control signals in the set of control signals; and 4) enables sector erase and program operations independent of the sector lock signal in response to a third state of control signals in the set of control signals.

33 Claims, 3 Drawing Sheets

WRITE PROTECTED, NON-VOLATILE MEMORY DEVICE WITH USER PROGRAMMABLE SECTOR LOCK CAPABILITY

BACKGROUND OF THE INVENTION

1. Field of the Invention

The present invention relates to integrated circuit, non-volatile memory devices; and more particularly to floating gate memory devices incorporating memory write protection features.

2. Description of Related Art

Flash memory based on floating gate transistor memory cells, provides non-volatile storage, which a user can program and erase while it is mounted in a system. Because flash memory is non-volatile, it is suitable for storing computer programs which are executed by the system. However, because it is possible that a user may mistakenly erase or program over the computer program, or that the data in the flash memory may otherwise be mistakenly altered, the use of flash memory for storing programs must be carefully managed. For example, programs which are executed when a system boots up, has traditionally been stored in read-only memory (ROM), such as mask ROM, which cannot be mistakenly changed by the user.

Flash memory has been developed with write protection features to reduce the likelihood that data in the flash memory will be mistakenly changed. For example, in U.S. Pat. No. 5,197,034, entitled Floating Gate Non-Volatile Memory with Deep Power Down and Write Lock-Out, invented by Fandrich et al., a method for protecting data stored in a certain block, referred to as the "boot block", of a flash memory array is described. The Fandrich et al. patent describes a system in which write lock-out protection circuitry is provided for the "boot block" to help maintain data integrity in the "boot block". Other blocks in the array do not have write lock-out protection circuitry associated with them, according to the Fandrich et al. patent. To enable the write lock-out circuitry, a control input having one of three states, namely logic 0, logic 1, and very high voltage, is provided. When the control input is at logic 0, a deep power down signal is generated to switch the memory into a substantially powered-off state to save power consumption. When the control input is at logic 1, the device is in normal operation. When the control input is in very high voltage, the boot block can be updated by erase or program operations. This method of protecting stored data has been used in some products manufactured by Intel Corporation of Santa Clara, Calif. For example, the 28F008BV-T/B, so called "Smart Voltage Boot Block Flash Memory Family" incorporates this feature (See Intel Flash Memory Data Book, Vol 1, 1996, pp 5-1 to 5-56, especially page 5-21). Table 1 describes the write protection method used in this Intel product.

TABLE 1

Write Protection Truth Table of Intel 28F008BV

| | | | Write Protection Provided | |
|---|---|---|---|---|
| $V_{PP}$ | $\overline{RP}$ | $\overline{WP}$ | Block Block | Regular Block |
| $V_{IL}$ | X | X | Locked | Locked |
| $\geq V_{PPLK}$ | $V_{IL}$ | X | Locked | Locked |
| $\geq V_{PPLK}$ | $V_{HH}$ | X | Unlocked | Unlocked |
| $\geq V_{PPLK}$ | $V_{IH}$ | $V_{IL}$ | Locked | Unlocked |
| $\geq V_{PPLK}$ | $V_{IH}$ | $V_{IH}$ | Unlocked | Unlocked |

Another approach has been applied to write protection, exemplified by the Advanced Micro Devices product AM29F080 (See AMD Flash Memory Book, 1996, pp. 1-163 to 1-196, especially 1-172). According to the AMD approach, the sector protect feature is enabled using programming equipment at the user's site. After the feature is enabled for a particular sector, both program and erase operations are disabled. Nonetheless, this feature allows temporary unprotection of previously protected sectors, by activating a reset pin to a very high voltage. During this mode, formerly protected sectors can be programmed or erased. Once the very high voltage is taken away from the reset pin, all previously protected sectors are protected again, according to the AMD architecture.

The Intel approach and the AMD approach do not provide significant flexibility to the user in selecting sectors of the flash memory device to be protected. In the Intel device, only the 'boot block' can be protected. In the AMD device, only those sectors which are selected during manufacturing can be protected.

In the Intel approach, a boot block can be programmed or erased by setting two pins to a high logic value in the system. However, it is possible that both pins can be accidentally set to a high logic value by mistake, or during a power on/power off transition. Consequently, data intended to be protected may be altered accidentally during these transitional periods.

Accordingly, it is desirable to provide an alternative approach to providing write protection in flash memory devices. For example, greater flexibility in the selection of write protected sectors should be provided. In addition, greater write protection, particularly during power transitions and the like is desirable. Finally, it is desirable that the user be able to change or add write protected sectors to the flash memory device during operation.

SUMMARY OF THE INVENTION

The present invention provides a user-programmable write protection scheme, which provides flexibility and superior write protect features over the prior art. The invention can be characterized as an integrated circuit memory which comprises an array of non-volatile erasable and programmable memory cells, including a plurality of sectors. Sector lock memory is included on the device which stores a sector lock signal for at least one sector in the array, indicating a protected status for a corresponding sector in the array. Thus, when the sector lock signal is set, the corresponding sector in the array is in a protected state. When the sector lock signal is reset, the corresponding sector is in an unprotected state. Sector protect logic is capable of overriding a sector lock signal in response to a state of control signals on the integrated circuit. Furthermore, the integrated circuit includes resources allowing the user to set or reset a sector lock signal on a sector-by-sector basis, without requiring a high voltage source in the system. In addition, the use of a high voltage source during manufacturing and programming can be relied upon to override sector lock status.

Accordingly, a unique combination of protection status is provided, allowing greater flexibility and better protection than is available in the prior art.

According to one aspect, the invention can be characterized as an integrated circuit memory comprising an array of non-volatile erasable and programmable memory cells including a plurality of sectors. A plurality of control inputs is provided on the integrated circuit for receiving a set of control signals. Address inputs receive address signals, and data input/outputs (I/Os) provide a path for transferring data into and out of the array on the integrated circuit. Command logic is coupled to the plurality of control inputs, and to at least one of the address inputs and data I/Os, and detects command sequences at the plurality of control inputs and at least one of the address inputs and the data I/Os. The command sequences indicate operations for the array, including a program operation, a sector erase operation, a read operation, and a sector lock operation, in which a sector lock signal is set for at least one sector of the array. Sector protect logic is included on the integrated circuit and coupled to the command logic. The sector protect logic includes sector lock memory implemented with non-volatile memory, such as floating gate transistors. The sector lock memory stores a sector lock signal for at least one sector in the array. The sector protect logic inhibits the sector erase and program operations in a particular sector in response to a set sector lock signal corresponding to the particular sector and to a first state of control signals in the set of control signals. For example, the first state of control signals includes a first control signal on a reset/power down pin set to a logic 1, and a second control signal on a write protect pin set to a logic 1.

According to another aspect of the invention, the sector protect logic enables the sector erase and program operations in response to a reset sector logic signal corresponding to the particular sector, and to the first state of control signals, where in this example, the reset/power down signal is at logic 1, and the write protect signal is at logic 1.

According to another aspect of the invention, the sector protect logic inhibits erase and program operations to the particular sector independent of the sector lock signal in response to a second state of control signals in the set of control signals. The second state in a preferred example, involves the reset/power down pin set to a logic 1, and the write protect pin set to a logic 0. Furthermore, the sector protect logic enables sector erase and program operations independent of the sector lock signal in response to a third state of control signals. In this example, the third state of control signals includes the reset/power down signal set to a logic 1, and the write protect signal set to a very high voltage.

According to yet another aspect of the invention, the command sequence detected by the command logic, indicating a sector lock operation, includes a multi-cycle command pattern on at least one of the address inputs and the data I/Os. The multi-cycle command pattern in an embodiment where there are plurality of sector lock signals corresponding to respective protectable blocks in the array, includes a cycle in which an address for a sector to be protected is supplied.

According to the aspects in which the command logic includes logic that detects a command sequence indicating a sector unlock operation, logic is included on the device to reset the sector lock signal in the sector lock memory in response to detection of a sector unlock command sequence. The command sequence for the sector unlock operation includes a multi-cycle command pattern on at least one of the address inputs and the data I/Os, and one cycle in the multi-cycle command pattern indicates an address for the sector to be unlocked. In order to enable a sector unlock operation, according to one embodiment of the invention, a state of control signals on inputs to the device is required, in which at least one control signal has a voltage state greater than the supply potential, such as a very high programming potential. This provides a sector lock operation which can be executed by the user, and a sector unlock operation, which is more difficult to accomplish. This asymmetry in the sector lock and sector unlock operations provides greater protection against inadvertent alteration of protected sectors.

According to another aspect of the invention, an integrated circuit flash memory device is provided, which includes command logic and sector protect logic, as discussed above. The command logic detects command sequences indicating operations for the array, including a program operation, a sector erase operation, a read operation, a sector lock operation, and a sector unlock operation. The sector protect logic includes sector lock memory, including non-volatile memory cells that store sector lock signals for at least one sector in the array. The sector protect logic provides functions including the following:

1.) Inhibits sector erase and program operations to a particular sector in response to a set sector lock signal corresponding to the particular sector, and to a first state of control signals in the set of control signals, 2.) Enables sector erase and program operations in response to a reset sector lock signal corresponding to the particular sector, and to the first state of control signals in the set of control signals, 3.) Inhibits sector erase and program operations to the particular sector independent of the sector lock signal in response to a second state of control signals in the set of control signals, and 4.) Enables sector erase and program operations independent of the sector lock signal in response to a third state of control signals in the set of control signals.

The sector lock and sector unlock operations are asymmetrical to prevent inadvertent changing in status of a protected block. For example, the sector lock signal for a protected block can only be changed from a set to a reset state by a command sequence including very high potential to a control input on the device in a preferred embodiment.

Accordingly, the present invention provides an improved flash memory device with write protection. The sector to be protected is user definable, and access to protected sectors is controlled by a combination of the write protection pin, the reset pin, the sector lock bit, and software command sequences allowing complete data protection. Software data protection protects the device from inadvertent program or erase. To unlock, write cycles must be presented to the device before the program or erase command can be accepted by the device. Also, hardware data protection is provided by controlling the states of the write protect and reset/power down pins.

Other aspects and advantages of the present invention can be seen upon review of the figures, the detailed description, and the claims which follow.

DETAILED DESCRIPTION

Figure 1:
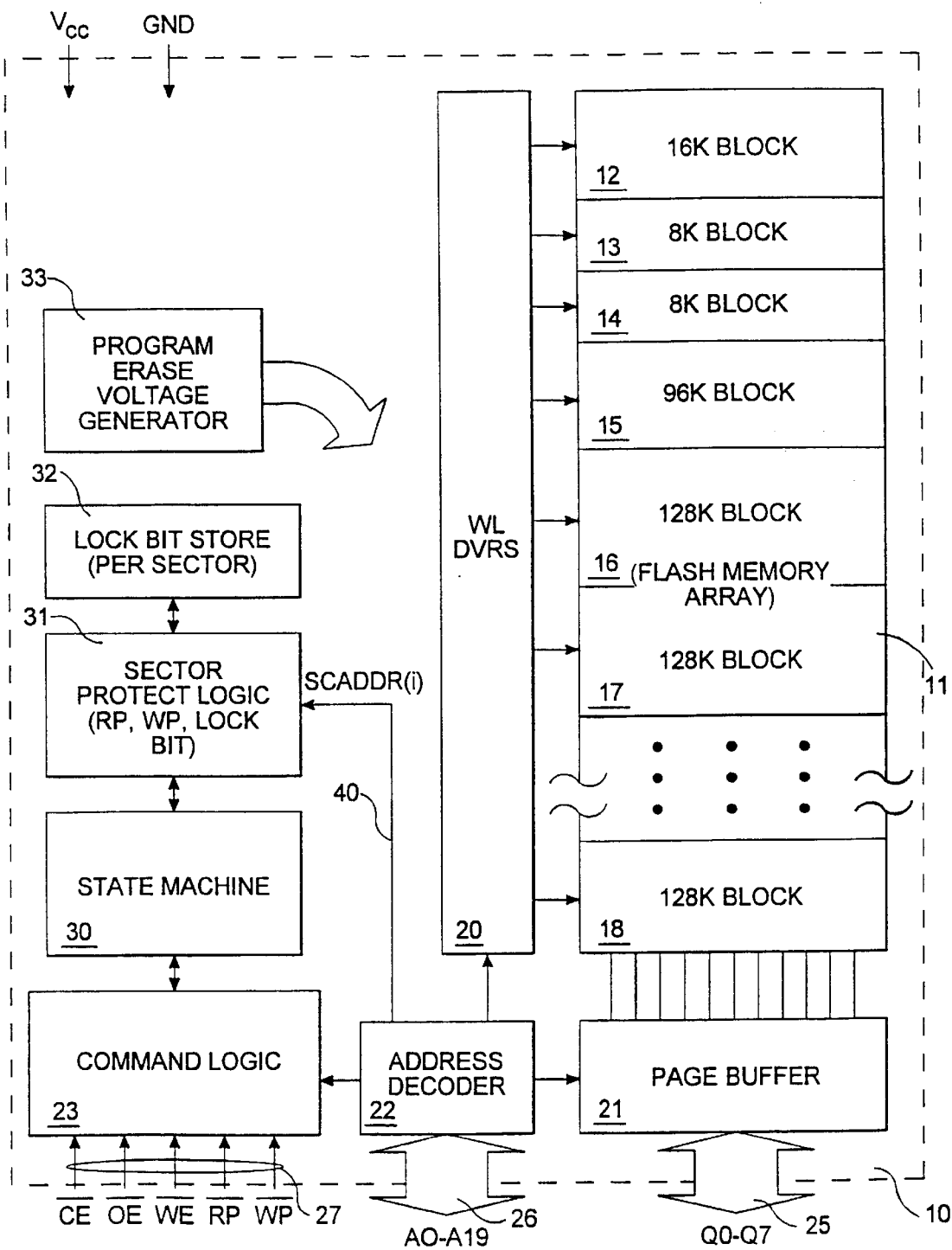
FIG. 1 is a simplified block diagram of an integrated circuit flash memory device with sector protect logic, according to the present invention.
Figure 2:
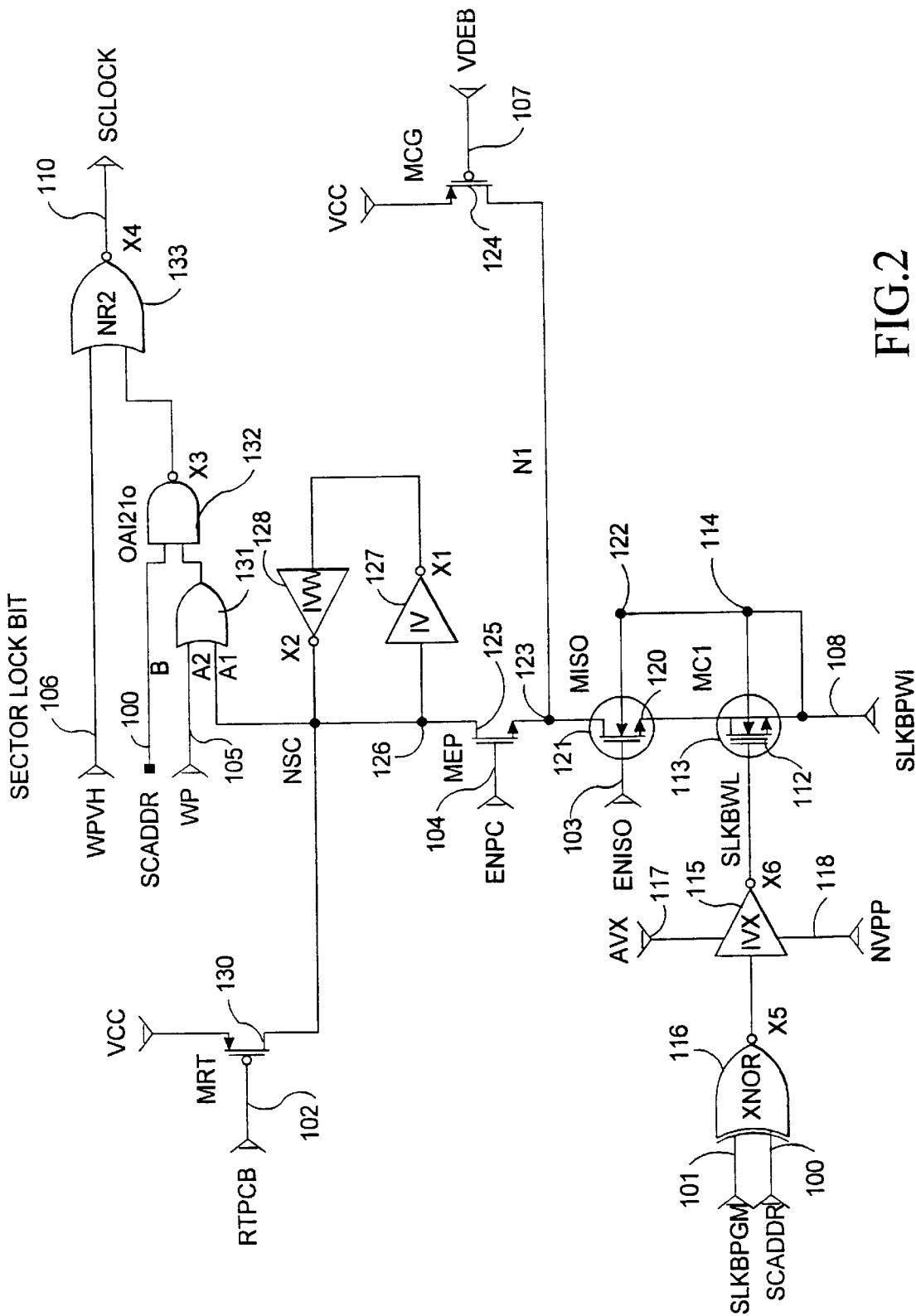
FIG. 2 is a circuit diagram of a sector lock bit memory element, according to the present invention.
Figure 3:
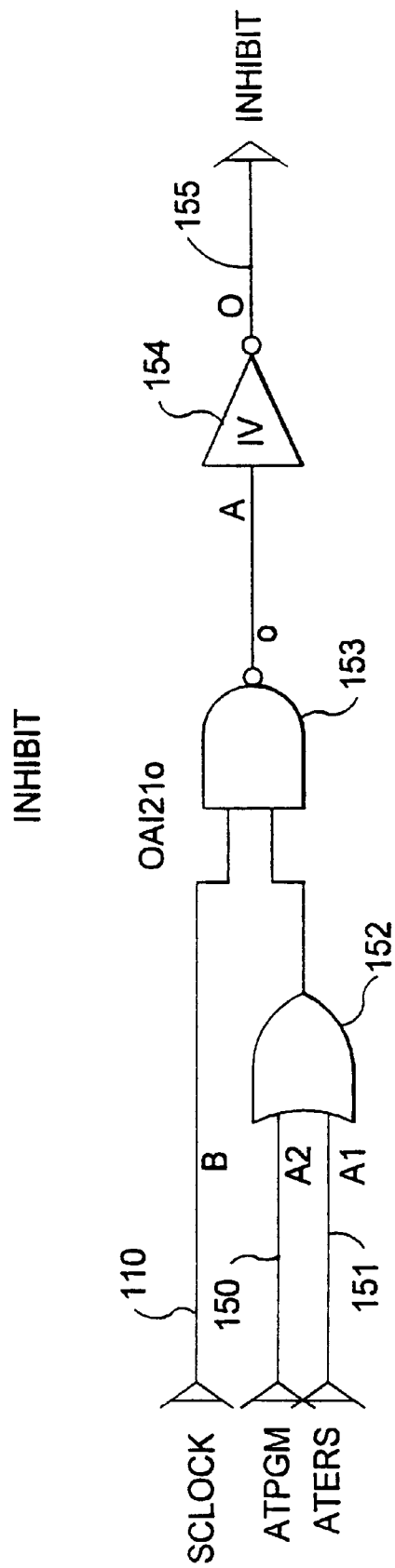
FIG. 3 is a logic diagram for logic producing an inhibit signal, according to the present invention.

A detailed description of embodiments of the present invention is provided with respect to FIGS. 1–3, in which FIG. 1 provides an overview of an integrated circuit memory having the write protect circuitry of the present invention.

FIG. 1 illustrates an integrated circuit 10, including a flash memory array 11. Flash memory array 11 is implemented in a preferred embodiment with a segmentable array of floating gate memory cells, such as described in U.S. Pat. No. 5,526,307 and/or U.S. Pat. No. 5,414,664. A variety of other flash memory architectures could be utilized. Flash memory array 11 includes an optimized sector architecture, including a 16K block 12, an 8K block 13, an 8K block 14, a 96K block 15, and seven additional 128K blocks 16, 17, . . . 18. This sector architecture includes 8 Megabits of storage in this embodiment. The present invention also is applicable to other size memory arrays with greater or lesser density, as suits a particular design.

In the simplified diagram of FIG. 1, a set of word line drivers 20 and a page buffer 21 are illustrated. In addition, an address decoder 22 and command logic 23 are shown. Page buffer 21 is connected to a set of data I/O pins, generally 25, designated Q0–Q7. Address decoder 22 is coupled to a set of address inputs 26, designated A0–A19. Command logic 23 is coupled to a set of control inputs 27 which receive a corresponding set of control signals.

According to one embodiment of the present invention, address inputs 26 are used for memory addresses. The addresses are internally latched during write cycles on the device. The data I/Os 25 are used for supplying data and commands during write cycles, and for outputting array status, identification data, status register content, and page buffer outputs in appropriate read modes. In this embodiment, data I/Os 25 flow to a high impedance state when the chip is deselected or the outputs are disabled.

The set of control inputs include the following:

$\overline{CE}$: Chip enable.

The chip enable signal activates the device's control logic, input buffers, decoders and sense amplifiers. With chip enable signal high, the device is deselected and power consumption reduces to a standby level upon completion of any ongoing program or erase operation. Chip enable is low to enable to device.

$\overline{OE}$: Output Enable.

The output enable signal gates the data of the device through the output buffers during a read cycle. Output enable is active low.

$\overline{WE}$: Write Enable.

The write enable signal controls writes to the command interface registers. Write enable is active low.

$\overline{RP}$: Reset/Power Down

The reset/power down signal is active low, and sets the device in a reset/power down mode. When the reset/power down signal is high, the device is in standard operation.

$\overline{WP}$: Write Protect

The write protect signal provides a method for locking the 16K block, or other selected block in the array, using three voltage levels (logic 0, logic 1, and a very high voltage, where very high voltage is a voltage higher than the supply potential $V_{CC}$). When write protect signal is low, the blocks in the array having a set sector lock bit are locked (where the "set" state may be a low or a high voltage). When write protect signal is high, the protected blocks are unlocked if the sector lock bit is reset. When write protect signal is at a very high voltage, the protected blocks are unlocked, regardless of the sector lock bit.

$V_{CC}$: Power Supply

The power supply pin supplies a supply potential to integrated circuit 10. In a preferred system, the supply potential is in the range of 2.7 V to 3.6 V. In other embodiments, the supply potential is about 5 V, typically the range of 4.5 V to 5.5 V. Other supply potentials can be used as suits a particular implementation.

GND: Ground

The ground pin provides a ground reference for the device.

Also shown in FIG. 1 are a state machine 30, sector protect logic 31, a sector lock bit store 32, and a program/erase voltage generator 33. As can be seen, command logic 23 is coupled to state machine 30. Upon detection of command sequences, including a state of control signals 27 and a sequence of inputs from at least one of address inputs 26 and data input/outputs 25, the state machine enters into one of a plurality of modes of operation, including a program mode, a sector erase mode, a chip erase mode, a read mode, a sector lock mode, and a sector unlock mode. The sector protect logic is responsive to the particular command sequence to inhibit or enable erase and program operations for sectors in flash memory array 11, which in a preferred embodiment is indicated by a sector address signal SCADDR(i) for sector (i) on line 40. The sector lock bit store 32 consists of a non-volatile memory which can be programmed and erased by the user, under the sector lock and sector unlock operation sequences. Program/erase voltage generator 33 generates the high voltages, negative voltages, and the like, which are used during the program and erase sequences, without requiring a high external voltage source for the chip.

The write protection provided by the sector protect logic 31 is set forth in Table 2, in one preferred embodiment. The voltage levels of the control inputs and the selection of the control inputs can be altered as suits a particular implementation.

TABLE 2

Write Protection Truth Table

| | | Corresp. Lock | Write Protection Provided | |
|---|---|---|---|---|
| $\overline{RP}$ | $\overline{WP}$ | Bit | *Protectable Block* | *Unprotectable Block* |
| $V_{IL}$ | X | X | Locked | Locked |
| $V_{IH}$ | $V_{HH}$ | X | Unlocked | Unlocked |
| $V_{IH}$ | $V_{IL}$ | X | Locked | Unlocked |
| $V_{IH}$ | $V_{IH}$ | 1 | Locked | Unlocked |
| $V_{IH}$ | $V_{IH}$ | 0 | Unlocked | Unlocked | where:
$V_{IL}$ = logic 0 voltage level
$V_{IH}$ = logic 1 voltage level
$V_{HH}$ = very high voltage (>$V_{CC}$)
X = don't care According to a preferred embodiment, the sector lock bit store includes a plurality of sector lock bits, each corresponding to a respective "protectable" sector in the array. For example, a first lock bit corresponds to the 16K block 12. A second lock bit corresponds to the 8K block 13. A third lock bit corresponds to the 8K block 14. A fourth lock bit corresponds to the 96K block 15. More or fewer sector lock bits may be included in the device as suits the needs of a particular implementation. In one preferred embodiment, only a single lock bit is provided for the 16K block 12. Sectors for which no sector lock bit is provided are referred to in Table 2 as "unprotectable."

Various protection states are accomplished using the reset/power down pin and the write protect pin in combination with the sector lock bits in store 32. First, when the reset/power down signal is logic 0, all sectors in the block are protected. No sector in array 11 can be erased or programmed with the reset/power down low. Also, the chip is switched to deep power down state to save power consumption.

If write protect pin is set to a logic 0, then blocks for which a sector lock bit is provided are locked independent of the status of the sector lock bit. Other blocks in array 11 are unlocked and normal erasing and programming can be executed without effecting protected blocks.

When the write protect pin is set to a very high voltage that is higher than the supply potential, the blocks for which a sector lock bit is provided are unlocked, as well as the rest of the array. Thus, blocks having sector lock bits can be erased and programmed independent of the status of the sector lock bit when a very high voltage (e.g., higher than the normal $V_{CC}$) is provided to the write protect pin.

When the write protect pin is a logic 1, and the reset/power down pin is a logic 1, the status of the sector lock bit controls the locked or unlocked status of the corresponding sectors. All blocks for which there is no sector lock bit are unlocked and can be programmed and erased. On the other hand, blocks for which a sector lock bit is provided are locked if the sector lock bit is set, and cannot be programmed or erased. If the sector lock bit is reset, then the block corresponding to the reset sector lock bit can be programmed and erased.

As mentioned above, the command logic detects a sector lock command sequence and initiates a sector lock operation. For example, the sector lock sequence includes setting the control signals to a state to accept the sector lock sequence, such as setting the chip enable signal to logic 0 and the write enable signal to logic 0. In addition, a sequence of at least one of addresses and data is supplied to the address inputs 26 and the data inputs 25 as appropriate. For example, to set a sector lock bit for a particular sector in the array, a sequence of bus write cycles is required. In the first bus write cycle, the address is set to 5555H and the data is set to AAH. In a second bus write cycle, the address equals 2AAAH and data equals 55H. In a third bus write cycle, the address equals 5555H and data equals 60H. In a fourth bus write cycle, the address equals 5555H and the data equals the address of the sector to be protected. In a fifth bus write cycle, the address equals 2AAAH and the data equals 55H. In a sixth bus write cycle, the address equals 00H and the data equals 20H.

After setting a sector lock bit for a selected sector, the status is read by reading a status register on the chip. To read the status, a sequence of bus cycles is utilized to determine whether the sector has been successfully locked by setting the sector lock bit for the corresponding sector.

A sector unlock operation is also available on a preferred embodiment of the present invention. According to the sector unlock operation, the control signals 27 are set to a particular state and a sequence of bus write cycles is utilized. The unlock sector command sequence is similar to the lock sector command sequence, except that a different of combination of address and data signals is utilized. In a preferred embodiment, the state of the control signals required to successfully unlock a sector is different than the state of control signals used in the sector lock operation. For example, to unlock a sector in one embodiment, it is necessary to set the write protect pin to a voltage level higher than the supply potential. This provides additional protection against accidentally unlocking a protected sector. In alternative systems, the asymmetry in the sector lock and sector unlock command sequences can be accomplished by using other combinations of control signal states.

FIG. 2 is a circuit diagram illustrating the sector lock bit store for a particular sector, according to the present invention. Corresponding sector lock bit stores are implemented for each sector to be protected in a device using the sector lock capability of the present invention. Thus, the circuit of FIG. 2 includes an input SCADDR on line 100, which is active high indicating that the corresponding sector has been selected for locking or unlocking. A second input SLKBPGM 101 is included and is active high when the bit is to be reset (programmed in this embodiment), and low when the bit is to be set (erased in this embodiment). A third input 102 receives the RTPCB signal. Input 103 receives the ENISO signal. Input 104 receives the ENPC signal. Input 105 receives the WP signal. Input 106 receives the WPVH signal. Input 107 receives the VDEB signal. Finally, input 108 receives the SLKBPWI signal. The output of the memory unit of FIG. 2 is SCLOCK signal on line 110.

The memory unit is based on a flash memory cell 112. Flash memory cell 112 is implemented in a p-well set within an n-well on a p-type substrate, as indicated by the circle 113. The p-well 114 is biased by the SLKBPWI signal on line 108. Also, the signal on line 108 is coupled to the source of flash memory cell 112. The gate of the flash memory cell receives a signal SLKBWL at the output of inverter 115. Inverter 115 receives its input from the output of exclusive-NOR gate 116. Inputs to exclusive-NOR gate 116 include the SCADDR signal on line 100 and the SLKBPGM signal on line 101. The power supply potential supplied to inverter 115 includes controllable positive voltage supply AVX on line 117 and a controllable ground and negative voltage supply NVPP on line 118. Signals AVX and NVPP are utilized to control the gate voltage of flash memory cell 112 during read, program and erase operations.

The drain of flash memory cell 112 is coupled to the source of transistor 120. Transistor 120 is a n-channel device which is formed in a p-well, that is formed inside a n-well in a p-type substrate, as represented by the circle 121. P-well 122 is biased with the same potential as the p-well 114 of the flash memory cell 112. The gate of transistor 120 is coupled to control signal ENISO on line 103. The drain of the transistor 120 is coupled to node 123. Node 123 is coupled to the drain of p-channel transistor 124. The source of p-channel transistor 124 is coupled to $V_{CC}$. The gate of p-channel transistor 124 is connected to the control signal VDEB on line 107. Also, node 123 is coupled to the source of n-channel transistor 125. The gate of n-channel transistor 125 is coupled to the control signal ENPC on line 104. The drain of transistor 125 is coupled to the node 126. Node 126 is coupled to a latch, comprised of inverter 127 and inverter 128, connected in a feedback arrangement to node 126. Also, node 126 is coupled to the drain of p-channel transistor 130. The source of p-channel transistor 130 is coupled to the supply potential $V_{CC}$, and the gate of p-channel transistor 130 is connected to the control signal RTPCB on line 102.

Node 126 is also connected to the logic including OR gate 131. A second input to OR gate 131 is the WP signal on line 105. The output of OR gate 131 is connected to NAND gate 132. The second input to NAND gate 132 is SCADDR signal on line 100. The output of NAND gate 132 is connected to NOR gate 133. The second input to the NOR gate 133 is the WPVH signal on line 106. The output of the NOR gate 133 is the SCLOCK signal on line 110.

In this embodiment, the sector lock bit stored by the circuitry of FIG. 2, is set by erasing the flash memory cell 112. During the erase process, the signals RTPCB on line 102 and ENPC on line 104 are low to preset the node 126 to a logic 1 value. When the corresponding sector in the array is selected, the signal SCADDR is equal to a logic 1. During the erase process, the signal SLKBPGM is logic 0 and the output of the exclusive-NOR gate 116 will be 0. This low signal is inverted and shifted to a very high voltage AVX (typically about 12 V) by the level shifting inverter 115. Meanwhile, the signal SLKBPWI is set to about −8 V, and the control signal VDEB is set equal to 1. The control signal ENISO is set to 0. This sets the gate electrode of flash memory cell 112 to about 12V, the source electrode to about −8 V, and the drain electrode is left floating. As a result flash memory cell 112 is erased to a high threshold state. When the erase procedure finishes, the voltage AVX on line 117 returns to $V_{CC}$, and both the control signals RTPCB on line 102, and ENPC on line 104 are set to a logic high. Because flash memory cell 112 will have a high threshold after erasure, it is essentially off. As a result, node 126 is kept at a high voltage. This information is stored in the latch comprising invertors 128 and 127. In a preferred embodiment, the inverter 128 is a weaker inverter than inverter 127 to aid maintaining the node 126 at a desired value.

After the erase or program process, with AVX on line 117 set to about the supply potential and NVPP on line 118 set to GND, flash memory cell 112 is in a normal read status and is utilized for the normal sector lock operations, as described above. During a normal read operation the signals are set as follows: RTPCB=1, ENPC=1, ENISO=1, and VDEB=1. Thus, when flash memory cell 112 is set (by erasing it to a high threshold in this embodiment), node 126 is high. This results in the output of OR gate 131 being high, independent of the write protect signal WP on line 105. When the address corresponding to the sector lock bit is selected, as indicated by line 100, the output of the NAND gate 132 is guaranteed to be low. When the signal WPVH on line 106 is low, corresponding to the state where the write protect pin is not at a very high voltage, and the output of NAND gate 132 is low, then the output of NOR gate 133 will be high, causing the SCLOCK signal to logic high on line 110, corresponding to a locked status.

To reset the locked bit, flash memory cell 112 must be programmed in this embodiment. Thus, during an unlocking process, both the RTPCB on line 102, and ENPC control signal on line 104 are set low, presetting node 126 to the logic 1 value. When the corresponding block is selected, the control signal SCADDR on line 100 is high. To program the block, the control signal SLKBPGM is set to a logic high. This causes the output of the exclusive-NOR gate 116 to be at a logic 1. This logical high signal is inverted by inverter 115 and shifted to a negative voltage of about −8 V (as set by the NVPP signal on line 118.) The signal SLKBPWI on line 108 is set to GND. The control signal VDEB is set to logic 0 and the control signal ENISO is set to logic 1. Thus, the drain of flash memory cell 112 is set to the supply potential. To program the cell, the gate electrode of flash memory cell 112 is connected to about −8 V, the drain electrode is connected to the supply potential, and the source electrode is grounded. As a result flash memory cell 112 is programmed to a low threshold state. After the programming procedure is finished, both the RTPCB control signal on line 102, and the ENPC control signal on line 104 are set to a high logic value. This turns off transistor 130 and turns on transistor 125. When flash memory cell 112 has a low threshold, a small amount of current flows through the flash cell when the control signal SLKBWL is set to the supply potential in the read mode. Consequently, the preset voltage at node 126 is discharged and the voltage becomes 0. Thus the lock bit is reset.

When node 126 is 0, the output of the OR gate 131 is controlled by the WP signal on line 105, which is the inverse of the active low write protect input to the chip. Thus, when the write protect input to the chip is low, the signal on line 105 is high. When the signal on line 105 is low, the write protect input is high. When the output of OR gate 131 is low, the output of NAND gate 132 is guaranteed to be high. Thus, a high value at the output of NAND gate 132 guarantees that the output of NOR gate 133 is low causing SCLOCK signal on line 110 to be logic low value.

FIG. 3 illustrates the inhibit logic as responsive to the signal SCLOCK on line 110. Inputs to the inhibit logic include the control signal ATPGM on line 150 and ATERS on line 151. The ATPGM control signal on line 150 is high when an attempted program is executed to a sector corresponding to the SCLOCK signal on line 110. The ATERS on line 151 is high when an erase is attempted to the sector corresponding to the SCLOCK signal on line 110. The signals on lines 150 and 151 are supplied to OR gate 152. The output of the OR gate 152 is supplied to NAND gate 153. The other input to the NAND gate 153 is SCLOCK signal on line 110. The output of the NAND gate 153 is supplied to an inverter 154. The output of the inverter 154 is the signal INHIBIT on line 155. The INHIBIT signal on line 155 is supplied to the state machine in the integrated circuit and inhibits erase and program operations to corresponding sectors when it is logic high, and enables erase and program operations to corresponding sectors when it is logic 0. Thus, if either a program or erase operation, as indicated by the signals on lines 150 and 151 is attempted to a sector corresponding to the SCLOCK signal on line 110, the output of NAND gate 153 is logic low. Inverter 154 inverts the signal to generate the INHIBIT signal on line 155. If the SCLOCK signal on line 110 is low, for an unprotected block or a reset sector lock signal for the corresponding block, then the output of the NAND gate 153 is high, causing the INHIBIT signal on line 155 to be a logic low, enabling the erase and program operations.

Thus, as shown in FIG. 2, when the write protect signal is at a very high voltage, the WPVH signal on line 106 is logic 1, and the signal WP is logic 0. In this way, the SCLOCK signal on line 110 is forced to a logic 0 and the INHIBIT signal is forced to a logic 0. As a result, the corresponding block is unlocked and can be programmed or erased normally independent of the sector lock bit.

When the signal WP equals logic 1, indicating that the write protect bit is at the logic low input level, the information in the sector lock bit is overridden. Thus, when the sector corresponding to the sector lock bit is selected, the SCADDR is logic 1. The output of NAND gate 132 will be logic 0, causing both SCLOCK signal on line 110 and INHIBIT signal on line 155 to a logic 1. In this way, the blocks having a corresponding sector lock bits are locked, regardless of the state of the sector lock signal.

Finally, when the signal WP equals 0, indicating that the write protect bit is the logic high voltage level, the voltage level of SCLOCK signal on line 110 is dependent on the stored sector lock bit. If the sector lock bit is logic 1, both SCLOCK signal on line 110 and INHIBIT signal on line 155 are logic 1 when the corresponding block is selected, as indicated by the SCADDR equal to 1. In this case, the corresponding block is locked and protected. However, if the sector lock bit is logic 0, then both SCLOCK signal on line 110 and INHIBIT signal on line 155 are logic 0. As a result, the corresponding block is not protected.

In summary, a variety of protection states is provided according to the present invention. Protection states are based on a combination of the reset/power down pin, the write protect pin, and the sector lock bit. For complete protection, the reset/power down pin is set to a logic low level. This prevents erasing and programming all sectors in the array. For protection of blocks having a sector lock bit associated with them, the write protect pin is set to the logic low value. Thus, blocks are locked independent of the status of their sector lock bit, while other segments of the array, for which no sector lock bit is provided, are in a state allowing programming and erasing.

In order to unlock sectors which have a set sector lock bit, the write protect pin is set to a very high voltage, or a voltage higher than the supply potential. Thus, all blocks are unlocked and can be programmed and erased in this state of the control signals. This feature overrides the sector lock bit protection.

For normal block unlocking, the write protect bit it set to a logic 1, and the reset/power down bit is set to a logic 1. This allows all blocks having a corresponding lock bit to be programmed or erased only if the sector lock bit is reset. Sectors on the array for which no sector lock bit is provided are unlocked in this state.

Accordingly, data is more securely stored in a flash memory device, according to the present invention, because multiple layers of protection provided to the user. Further, the protection status is more flexible than available in the prior art, allowing users to set and reset sector lock bits as needed. Finally, because more than one block in the array is provided with a sector lock bit, in preferred embodiments, users have more choices in the arrangement of protected blocks that suits a particular implementation.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory, comprising:
   an array of non-volatile erasable and programmable memory cells, including a plurality of sectors;
   a plurality of control inputs for receiving a set of control signals;
   address inputs for receiving address signals;
   data input/outputs for transferring data into and out of the array;
   command logic, coupled to the plurality of control inputs, and to at least one of the address inputs and the data input/outputs, which detects command sequences at the plurality of control inputs and the at least one of the address inputs and the data input/outputs, indicating operations for the array, including a program operation to program data in the array, a sector erase operation to erase a sector of the array, a read operation to read data in the array, and a sector lock operation to set a sector lock signal for at least one sector in the array;
   sector protect logic coupled to the command logic, including non-volatile, sector lock memory which stores the sector lock signal for at least one sector in the array indicating a protect status for a corresponding sector in the array; which inhibits the sector erase and program operations in a particular sector in response to a set sector lock signal corresponding to the particular sector and to a first state of control signals in the set of control signals; and
   erase, program and read circuits responsive to the command logic and the sector protect logic to execute the sector erase, program and read operations, and to execute the sector lock operation.

2. The integrated circuit of claim 1, wherein the sector protect logic enables the sector erase and program operations in response to a reset sector lock signal corresponding to the particular sector and to the first state of control signals in the set of control signals.

3. The integrated circuit of claim 1, wherein the sector protect logic inhibits sector erase and program operations to the particular sector independent of the sector lock signal in response to a second state of control signals in the set of control signals, and enables sector erase and program operations independent of the sector lock signal in response to a third state of control signals in the set of control signals.

4. The integrated circuit of claim 1, wherein the command sequence detected by the command logic indicating a sector lock operation includes a multi-cycle command pattern on the at least one of the address inputs and the data input/outputs.

5. The integrated circuit of claim 4, wherein the multi-cycle command pattern includes a cycle in which an address for a sector to be protected is supplied.

6. The integrated circuit of claim 1, wherein the sector lock memory comprises a floating gate memory cell.

7. The integrated circuit of claim 1, wherein the integrated circuit receives a supply potential of about five volts or less, and the first state of the set of control signals includes a first control signal having a voltage state less than or equal to the supply potential and a second control signal having a voltage state less than or equal to the supply potential.

8. The integrated circuit of claim 7, wherein the voltage states of the first and second control signals in the first state of control signals are high logic levels.

9. The integrated circuit of claim 3, wherein the integrated circuit receives a supply potential of about five volts or less, the second state of control signals includes a first control signal having a voltage state less than or equal to the supply potential and a second control signal having a voltage state less than or equal to the supply potential, and the third state of control signals includes the first control signal having a voltage state less than or equal to the supply potential and the second control signal having a voltage state greater than the supply potential.

10. The integrated circuit of claim 9, wherein the voltage state of the first control signal in the second state and the third state of control signals is a high logic level.

11. The integrated circuit of claim 10, wherein the voltage state of the second control signal in the second state of control signals is a low logic level.

12. The integrated circuit of claim 1, wherein the command logic includes logic which detects a command sequence indicating a sector unlock operation, and including circuits to reset the at least one sector lock signal in the sector lock memory in response to detection of a sector unlock command sequence by the command logic.

13. The integrated circuit of claim 12, wherein the command sequence detected by the command logic indicating a sector unlock operation includes a multi-cycle command pattern on the at least one of the address inputs and the data input/outputs.

14. The integrated circuit of claim 13, wherein the multi-cycle command pattern includes a cycle in which an address for a sector to be unlocked is supplied.

15. An integrated circuit memory, comprising:

an array of floating gate memory cells, including a plurality of sectors;

a supply voltage input for receiving a supply potential;

a plurality of control inputs for receiving a set of control signals;

address inputs for receiving address signals;

data input/outputs for transferring data into and out of the array;

command logic, coupled to the plurality of control inputs, and to at least one of the address inputs and the data input/outputs, which detects command sequences at the plurality of control inputs and the at least one of the address inputs and the data input/outputs, indicating operations for the array, including a program operation to program data in the array, a sector erase operation to erase a sector of the array, a read operation to read data in the array, and a sector lock operation to set a sector lock signal for at least one sector in the array;

sector protect logic coupled to the command logic, including sector lock memory including a floating gate memory cell, which stores the sector lock signal for at least one sector in the array indicating a protect status for a corresponding sector in the array, which inhibits the sector erase and program operations in a particular sector in response to a set sector lock signal corresponding to the particular sector and to a first state of control signals in the set of control signals, and enables the sector erase and program operations in response to a reset sector lock signal corresponding to the particular sector and to the first state of control signals in the set of control signals; and erase, program and read circuits responsive to the command logic and the sector protect logic to execute the sector erase, program and read operations, and to execute the sector lock operation, wherein the first state of control signals consists of control signals in the set of control signals having voltage states less than or equal to the supply potential.

16. The integrated circuit of claim 15, wherein the sector protect logic inhibits sector erase and program operations to the particular sector independent of the sector lock signal in response to a second state of control signals in the set of control signals, and enables sector erase and program operations independent of the sector lock signal in response to a third state of control signals in the set of control signals;

wherein the third state of control signals includes a control signal in the set of control signals having a voltage state greater than the supply potential.

17. The integrated circuit of claim 15, wherein the command sequence detected by the command logic indicating a sector lock operation includes a multi-cycle command pattern on the at least one of the address inputs and the data input/outputs.

18. The integrated circuit of claim 17, wherein the multi-cycle command pattern includes a cycle in which an address for a sector to be protected is supplied.

19. The integrated circuit of claim 18, wherein the sector lock memory includes a plurality of floating gate cells storing respective sector lock signals for a plurality of sectors in the array.

20. The integrated circuit of claim 15, wherein the command logic further detects a command sequence indicating a sector unlock operation, which includes a multi-cycle command pattern on the at least one of the address inputs and the data input/outputs.

21. The integrated circuit of claim 20, wherein the command sequence indicating a sector lock operation includes a second state of control signals in the set of control signals, and the command sequence indicating a sector unlock operation includes a third state of control signals in the set of control signals, and wherein the second state is different than the third state, and the third state of control signals includes a control signal in the set of control signals having a voltage state greater than the supply potential.

22. The integrated circuit of claim 15, wherein the command logic includes logic which detects a command sequence indicating a sector unlock operation, and including circuits to reset the at least one sector lock signal in the sector lock memory in response to detection of a sector unlock command sequence by the command logic.

23. The integrated circuit of claim 22, wherein the command sequence detected by the command logic indicating a sector unlock operation includes a multi-cycle command pattern on the at least one of the address inputs and the data input/outputs.

24. The integrated circuit of claim 23, wherein the multi-cycle command pattern includes a cycle in which an address for a sector to be unlocked is supplied.

25. An integrated circuit memory, comprising:

an array of floating gate memory cells, including a plurality of sectors;

a supply voltage input for receiving a supply potential;

a plurality of control inputs for receiving a set of control signals;

address inputs for receiving address signals;

data input/outputs for transferring data into and out of the array;

command logic, coupled to the plurality of control inputs, and to at least one of the address inputs and the data input/outputs, which detects command sequences at the plurality of control inputs and the at least one of the address inputs and the data input/outputs, indicating operations for the array, including a program operation to program data in the array, a sector erase operation to erase a sector of the array, a read operation to read data in the array, a sector lock operation to set a sector lock signal for at least one sector in the array, and a sector unlock operation to reset a sector lock signal for the at least one sector of the array;

sector protect logic coupled to the command logic, including sector lock memory including a floating gate memory cell, which stores the sector lock signal for at least one sector in the array indicating a protect status for a corresponding sector in the array; which inhibits the sector erase and program operations in a particular sector in response to a set sector lock signal corresponding to the particular sector and to a first state of control signals in the set of control signals, enables the sector erase and program operations in response to a reset sector lock signal corresponding to the particular sector and to the first state of control signals in the set of control signals, inhibits sector erase and program operations to the particular sector independent of the sector lock signal in response to a second state of control signals in the set of control signals, and enables sector erase and program operations independent of the sector lock signal in response to a third state of control signals in the set of control signals; and erase, program and read circuits responsive to the command logic and the sector protect logic to execute the sector erase, program and read operations, and to execute the sector lock and the sector unlock operations, wherein the first state of control signals consists of control signals in the set of control signals having voltage states less than or equal to the supply potential.

26. The integrated circuit of claim 25, wherein the third state of control signals includes a control signal in the set of control signals having a voltage state greater than the supply potential.

27. The integrated circuit of claim 25, wherein the command sequence detected by the command logic indicating a sector lock operation includes a multi-cycle command pattern on the at least one of the address inputs and the data input/outputs.

28. The integrated circuit of claim 27, wherein the multi-cycle command pattern includes a cycle in which an address for a sector to be protected is supplied.

29. The integrated circuit of claim 28, wherein the sector lock memory includes a plurality of floating gate cells storing respective sector lock signals for a plurality of sectors in the array.

30. The integrated circuit of claim 25, wherein the command sequence indicating a sector unlock operation includes a multi-cycle command pattern on the at least one of the address inputs and the data input/outputs.

31. The integrated circuit of claim 25, wherein the command sequence indicating a sector lock operation includes a fourth state of control signals in the set of control signals, and the command sequence indicating a sector unlock operation includes a fifth state of control signals in the set of control signals, and wherein the fourth state is different than the fifth state, and the fifth state of control signals includes a control signal in the set of control signals having a voltage state greater than the supply potential.

32. The integrated circuit of claim 31, wherein the command sequence detected by the command logic indicating a sector unlock operation includes a multi-cycle command pattern on the at least one of the address inputs and the data input/outputs.

33. The integrated circuit of claim 32, wherein the multi-cycle command pattern includes a cycle in which an address for a sector to be unlocked is supplied.

* * * * *